United States Patent
Contreras et al.

(10) Patent No.: US 9,036,305 B1
(45) Date of Patent: May 19, 2015

(54) MAGNETIC RECORDING DISK DRIVE WITH WRITE DRIVER TO WRITE HEAD TRANSMISSION LINE WITH MULTIPLE SEGMENTS HAVING DIFFERENT NUMBERS OF CONDUCTIVE TRACES

(71) Applicant: HGST Netherlands B.V., Amsterdam (NL)

(72) Inventors: John Thomas Contreras, Palo Alto, CA (US); Nobumasa Nishiyama, Yokohama (JP); Eiji Soga, Sagamihara (JP); Kazuhiro Nagaoka, Fujisawa (JP); Rehan Zakai, San Ramon, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/082,340

(22) Filed: Nov. 18, 2013

(51) Int. Cl.
    *G11B 5/55*     (2006.01)
    *G11B 5/02*     (2006.01)

(52) U.S. Cl.
    CPC .................................... *G11B 5/02* (2013.01)

(58) Field of Classification Search
    USPC ........................................................ 360/264.2
    See application file for complete search history.

(56) References Cited

U.S. PATENT DOCUMENTS

| | | | |
|---|---|---|---|
| 5,097,232 A | 3/1992 | Stopper | |
| 5,812,344 A | 9/1998 | Balakrishnan | |
| 5,995,328 A * | 11/1999 | Balakrishnan | 360/245.9 |
| 6,275,358 B1 * | 8/2001 | Balakrishnan et al. | 360/264.2 |
| 6,356,113 B1 | 3/2002 | Contreras et al. | |
| 6,493,190 B1 * | 12/2002 | Coon | 360/245.9 |
| 6,762,913 B1 * | 7/2004 | Even et al. | 360/246 |
| 6,798,597 B1 | 9/2004 | Aram et al. | |
| 7,417,818 B2 | 8/2008 | Yuuki et al. | |
| 7,724,478 B2 * | 5/2010 | Deguchi et al. | 360/245.9 |
| 8,107,177 B2 | 1/2012 | Contreras et al. | |
| 8,154,827 B2 * | 4/2012 | Contreras et al. | 360/264.2 |
| 8,189,281 B2 | 5/2012 | Alex et al. | |
| 8,233,240 B2 | 7/2012 | Contreras et al. | |
| 8,351,158 B2 * | 1/2013 | Zhu et al. | 360/234.5 |
| 8,446,696 B2 * | 5/2013 | Feng et al. | 360/264.2 |
| 8,488,279 B1 * | 7/2013 | Pan et al. | 360/245.9 |
| 8,598,460 B2 * | 12/2013 | Contreras et al. | 174/115 |
| 8,605,389 B1 * | 12/2013 | Pan et al. | 360/245.9 |
| 2003/0053257 A1 * | 3/2003 | Wada et al. | 360/245.9 |

* cited by examiner

*Primary Examiner* — Mark Blouin
(74) *Attorney, Agent, or Firm* — Thomas R. Berthold (57) ABSTRACT

A multiple-segment transmission line in a hard disk drive enables a wider optimization range of the slope, duration and amplitude of the transmission line overshoot (TLO) wave shape. There is a first segment with two traces for connection to the write driver circuitry, an end segment with two traces for connection to the write head and at least two intermediate segments. The number of traces in a segment is different from the number of traces in the segments to which the segment is immediately connected. There is an even number of traces in each segment and the traces in each segment are interleaved. The number of segments and the number of traces in each segment can be selected to achieve the desired impedance levels for the different segments to achieve the desired wave shape for the TLO. All of the traces on the transmission line are preferably coplanar.

10 Claims, 11 Drawing Sheets

MAGNETIC RECORDING DISK DRIVE WITH WRITE DRIVER TO WRITE HEAD TRANSMISSION LINE WITH MULTIPLE SEGMENTS HAVING DIFFERENT NUMBERS OF CONDUCTIVE TRACES

BACKGROUND OF THE INVENTION

1. Field of the Invention

The invention relates generally to the interconnect between the read/write circuitry and the read/write head in a magnetic recording hard disk drive (HDD), and more particularly to an interconnect with a multiple-segment transmission line for optimizing transmission line overshoot (TLO) of the write current pulses.

2. Description of the Related Art

In magnetic recording HDDs, the read/write head is formed on an air-bearing slider that rides on a thin film of air above the rotating disk. A mechanical suspension comprised of a flexure with a gimbal at its end connects the slider to the disk drive's actuator arm. The slider is attached to the gimbal that allows for slight movement on the air bearing as the disk rotates. A transmission line provides electrical connection from the read/write circuitry, typically in a read pre-amplifier/write driver module or chip, through a short flex cable and suspension to the read and write elements on the slider. A suspension that integrates the mechanical connection with the electrical connection is called an integrated lead suspension (ILS) that is connected between the flex cable and connection pads on the slider. A typical ILS is a generally flexible laminate of a conductive metal substrate like stainless steel, an insulating dielectric layer like polyimide, and electrically conductive copper lines or traces patterned on the dielectric layer. The transmission line for the signals from the write driver to the write head thus include electrically conductive traces on the flex cable and the ILS.

The write driver circuitry typically provides a single-point input to the transmission line for each of the positive and negative write signals (+W and −W). The write driver circuitry provides current through the transmission line to the write element or head. The write driver circuitry power supply voltage and performance of the current through the write head depends on the characteristic impedance of the transmission line because the launch voltage at the write driver's output directly depends on the write-current signal times the characteristic impedance.

In current HDDs, boosts or overshoot of the write current pulses to the write head are used to overcome the relatively slow magnetic response of the head and media, i.e., the magnetic recording layer on the disk. Thus, the overshoot is required to create the precise magnetic write field profile with sharp field gradient, i.e., the correct magnetic "footprint", in the disk media. The lack of a precise magnetic footprint can cause problems at low and high data rates. Therefore, the overshoot of the write current pulses is typically required at all times. The typical solution to achieving fast magnetic flux reversals is to use electronics in the write driver circuitry to create write current overshoot. However, the use of electronics can be a limiting factor as data rates are increased and power supply voltages are reduced, which limits the write driver's current drive capability. Another approach for achieving faster magnetic flux reversals uses transmission line reflections. This inherent transmission line overshoot (TLO) approach reduces the overshoot requirement from the write driver circuitry.

What is needed is a HDD with a write driver to write head transmission line with multiple segments that enable optimization of the TLO wave shape.

SUMMARY OF THE INVENTION

Embodiments of the invention relate to a multiple-segment transmission line in a HDD that enables a wider optimization range of the TLO wave shape, specifically the slope, duration and amplitude of the TLO. There is a first segment with two traces for connection to the write driver circuitry, an end segment with two traces for connection to the write head and at least two intermediate segments. The number of traces in a segment is different from the number of traces in the segments to which the segment is immediately connected. There is an even number of traces in each segment and the traces in each segment are interleaved. The number of segments and the number of traces in each segment can be selected to achieve the desired impedance levels for the different segments to achieve the desired wave shape for the TLO. All of the traces on the transmission line are preferably coplanar which is made possible by the use of multiple coplanar crossover interconnects.

For a fuller understanding of the nature and advantages of the present invention, reference should be made to the following detailed description taken together with the accompanying figures.

DETAILED DESCRIPTION OF THE INVENTION

Figure 1:
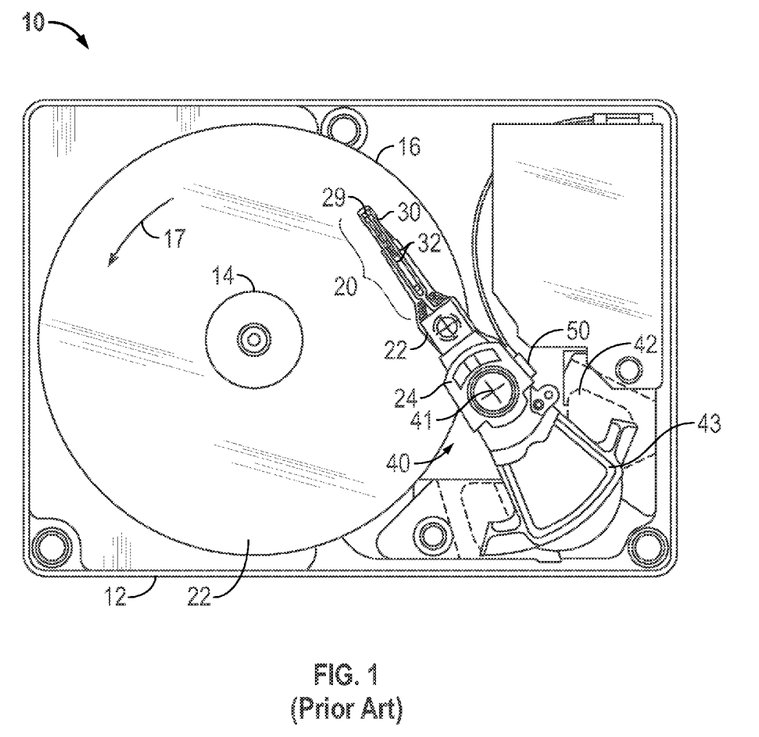
FIG. 1 is a top plan view of a head/disk assembly (HDA) of a hard disk drive and illustrates an integrated lead suspension (ILS) having a transmission line according to the prior art.

FIG. 1 is a top plan view of a head/disk assembly (HDA) of a hard disk drive 10. The hard disk drive 10 has at least one load beam assembly 20 having an integrated lead suspension (ILS) 30 according to the prior art with an array of electrically conductive lines or traces 32 that connect to a read/write head 29. The load beam assemblies 20 are attached to rigid arms 22 connected to an E-block 24. The disk drive 10 includes a rigid base 12 supporting a spindle 14 that supports a stack of disks, including top disk 16. The spindle 14 is rotated by a spindle motor (not shown) for rotating the disks in the direction shown by curved arrow 17. Disk drive 10 also includes a rotary actuator assembly 40 rotationally mounted to the base 12 at a pivot point 41. The actuator assembly 40 is a voice coil motor (VCM) actuator that includes a magnet assembly 42 fixed to base 12 and a voice coil 43. When energized by control circuitry (not shown) the voice coil 43 moves and thereby rotates E-block 24 with attached arms 22 and load beam assemblies 20 to position the heads 29 to the data tracks on the disks. The traces 32 connect at one end to the read/write head 29 and at its other end through a short flex cable to read/write circuitry contained in an electrical module or chip 50 secured to a side of the E-block 24. The chip 50 includes a read preamplifier/write driver circuit.

Figure 2A:
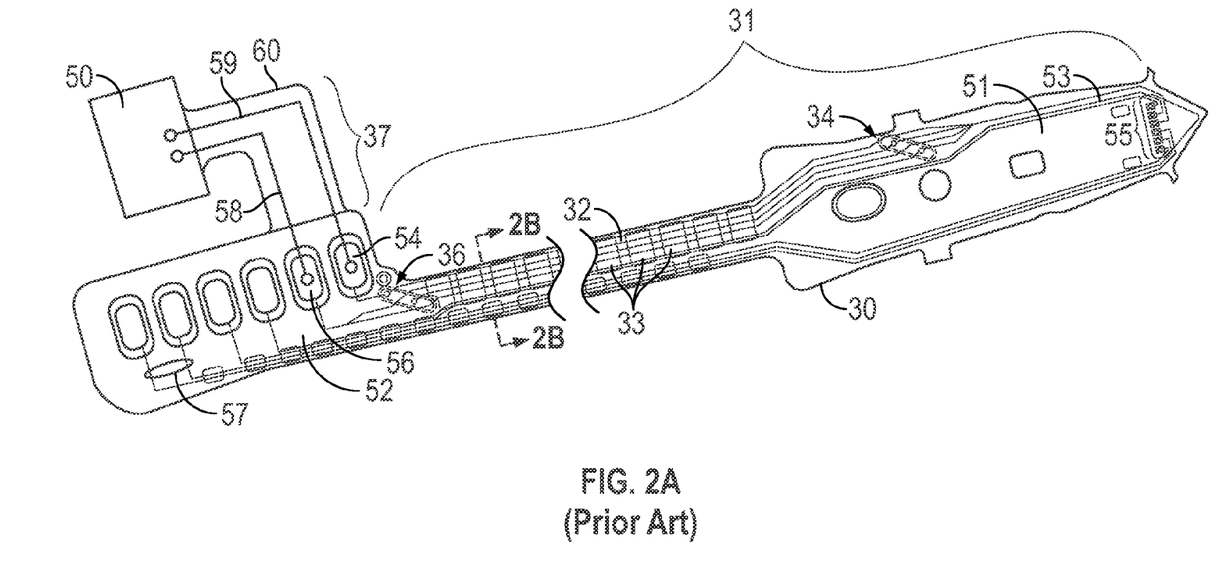
FIG. 2A is a plan view of the ILS and read/write chip showing a four-interleave transmission line between the read/write chip and the gimbal portion of the ILS according to the prior art.

FIG. 2A is a plan view according to the prior art of the ILS 30 and chip 50 showing the transmission line that connects the chip 50 with the read/write head. The ILS 30 includes a transmission line 31 between a gimbal portion 51 and a flex cable pad portion 52. The ILS 30 is a laminate comprised of three layers: an electrically conductive substrate, an insulating dielectric layer, a conductive layer for the electrical traces or lines, and an optional insulating dielectric cover layer. The gimbal portion 51 supports a slider (not shown) that contains the read/write heads 29 (FIG. 1) and has conductive traces 53 leading to pads 55 for electrical connection to pads on the slider. The ILS 30 has an electrical connection end 34 that is connected to traces 53 on gimbal portion 51. The flex cable pad portion 52 has a plurality of electrical connection pads, like pads 54, 56 that are electrically connected to chip 50 via a flex cable 60. The flex cable 60 connects the chip 50 mounted on the side of the E-block 24 (FIG. 1) to the pads, like pads 54, 56 on the ILS 30. Only the negative write (−W) and positive (+W) electrical leads 58, 59, respectively, are depicted to simplify the illustration in FIG. 2A. The ILS 30 has an electrical connection end 36 that is connected to pads 54, 56 on flex cable pad portion 52. A plurality of interleaved electrically conductive traces or lines 32, extend generally parallel to one another along the body of the ILS 30 between the flex cable pad portion 52 and the gimbal portion 51. The lines 32 form part of the transmission line 31 of the ILS 30 from the write driver in chip 50 to the write head on the slider attached to gimbal end 51. The other part of the transmission line from the write driver in chip 50 to the write head is the transmission line 37 on flex cable 60, specifically lines 58, 59. The ILS 30 also includes conductive traces or lines 57 that connect the read preamplifier in chip 50 with the read head on the slider attached to gimbal end 51.

Figure 2B:
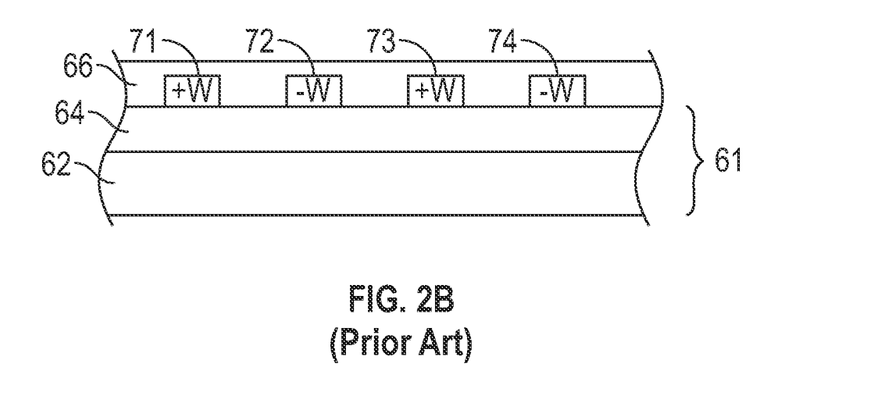
FIG. 2B is an expanded sectional view through section 2B-2B of the ILS in FIG. 2A to illustrate its laminated construction.

FIG. 2B is an expanded sectional view through section 2B-2B of transmission line segment 31 in FIG. 2A and shows its laminated construction. The transmission line segment 31 includes a generally planar support member 61, a plurality of four interleaved electrically conductive write traces or lines, like lines 71, 73 in a first set and lines 72, 74 in a second set, and an optional insulating dielectric cover layer 66. The lines 71-74 carry differential write signals (+W and −W) with the signals being interleaved. Interleaving means that the +W and −W signal traces are adjacent one another, as shown in FIG. 2B. The support member 61 includes a conductive base or substrate 62, typically formed of metal like stainless steel, and an insulator layer 64, formed of a dielectric material like polyimide, between the traces 71-74 and substrate 62. The support substrate 62 is typically about 18 microns thick and the insulating dielectric layer 64 is typically about 10 microns thick. The optional dielectric cover layer 66 is also typically formed of polyimide to a thickness of about 15 microns over the tops of the lines 71-74. The write lines are typically formed of copper and are shown as being divided into four interleaved lines along the entire length of transmission line 31.

Figure 2C:
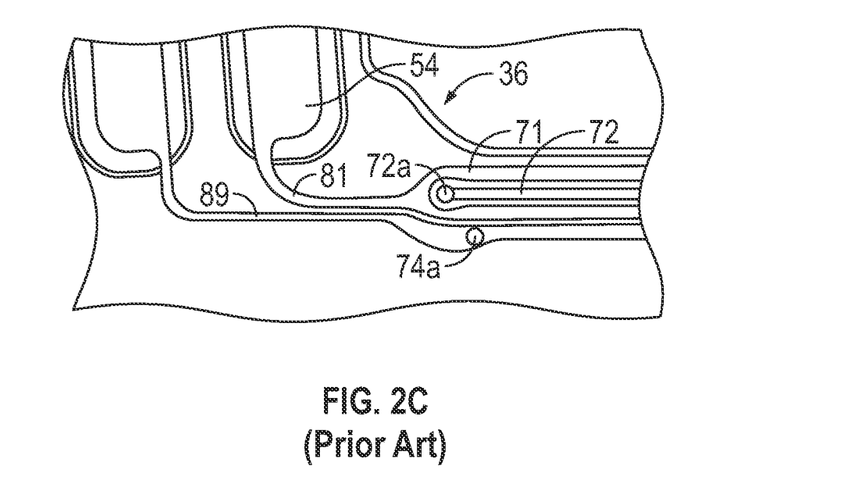
FIG. 2C is a plan view of a portion of the ILS showing an end with the interleaved connection of the +W and −W signal lines to the pads.

FIG. 2C is a plan view of a portion of ILS 30 showing end 36 and the manner in which the four interleaved lines (71, 73 and 72, 74) are connected to the two write leads 81, 89. Pad 54 is connected to the +W signal and is connected via lead 81 directly to lines 71 and 73. Pad 56 is connected to the −W signal and is connected directly via lead 89 to line 74 and then through vias 74a, 72a to line 72. Each signal from the write driver circuitry in chip 50 (FIG. 2A) is thus fanned out into two lines, with the +W and −W signals being interleaved along the transmission line 31 as shown.

Figure 3:
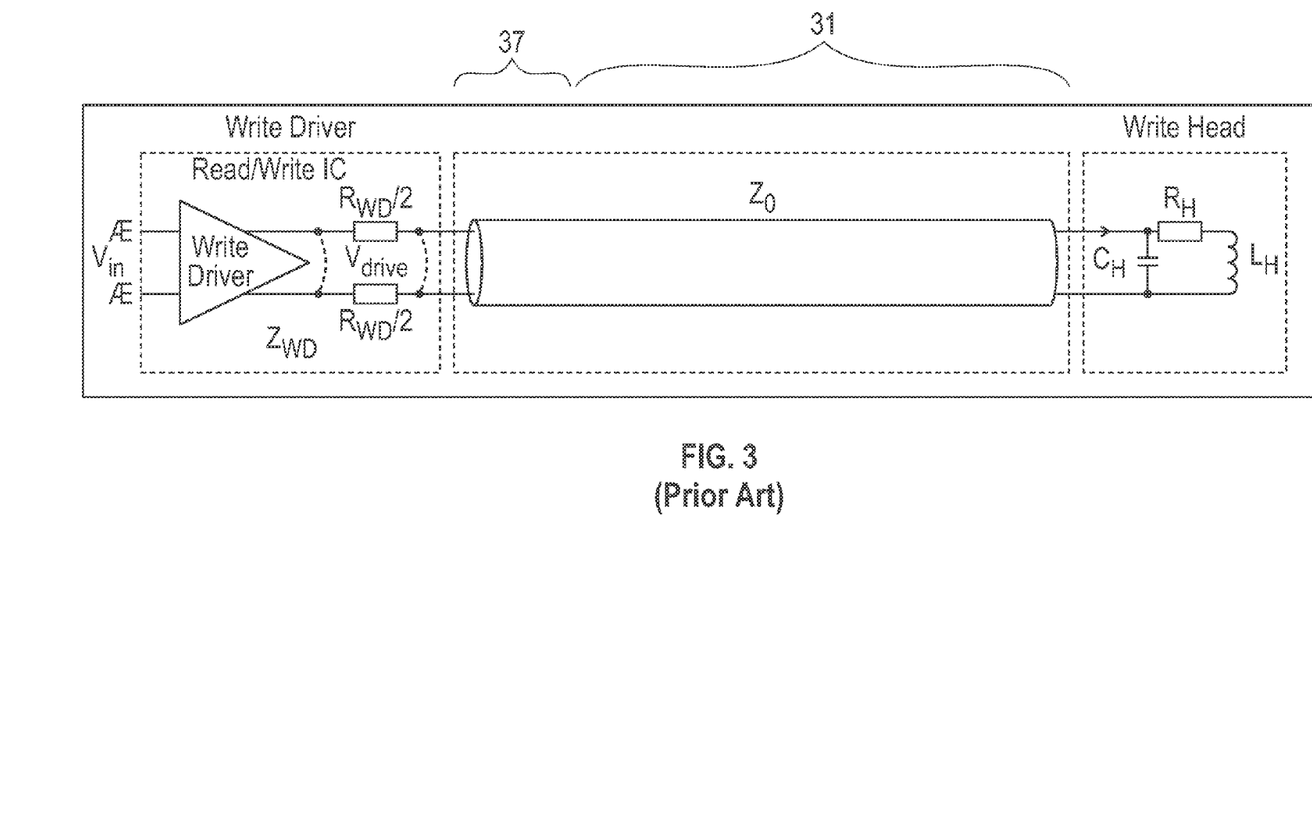
FIG. 3 is a schematic representation of the differential signal mode and illustrates the transmission line with characteristic impedance $Z_0$ between the write driver circuitry and the write head according to the prior art.

FIG. 3 is a schematic illustration of the interconnect between the write driver circuitry and the write head according to the prior art. The write driver operates at a voltage $V_{drive}$ and has a resistance $R_{WD}$, represented by two resistors, each with resistance $R_{WD}/2$. The write driver circuitry is required to supply a wideband signal, typically with relevant frequency content from as low as 0.01 GHz up to 2.0 GHz or higher in future higher data rate hard disk drive systems. The write driver circuitry is connected to the transmission line 37 of flex cable 60 (FIG. 2A) and the write head is connected to the transmission line 31 of the ILS 30 (FIG. 2A). In current disk drives, boosts or overshoot of the write current pulses to the write head are used to create precise magnetic footprints in the disk media. This precision is required at low data rates and at high data rates. Typically, the relatively slow magnetic flux reversal in the head and media is the bottleneck to achieving higher performance in data rates and areal densities.

Figure 4:
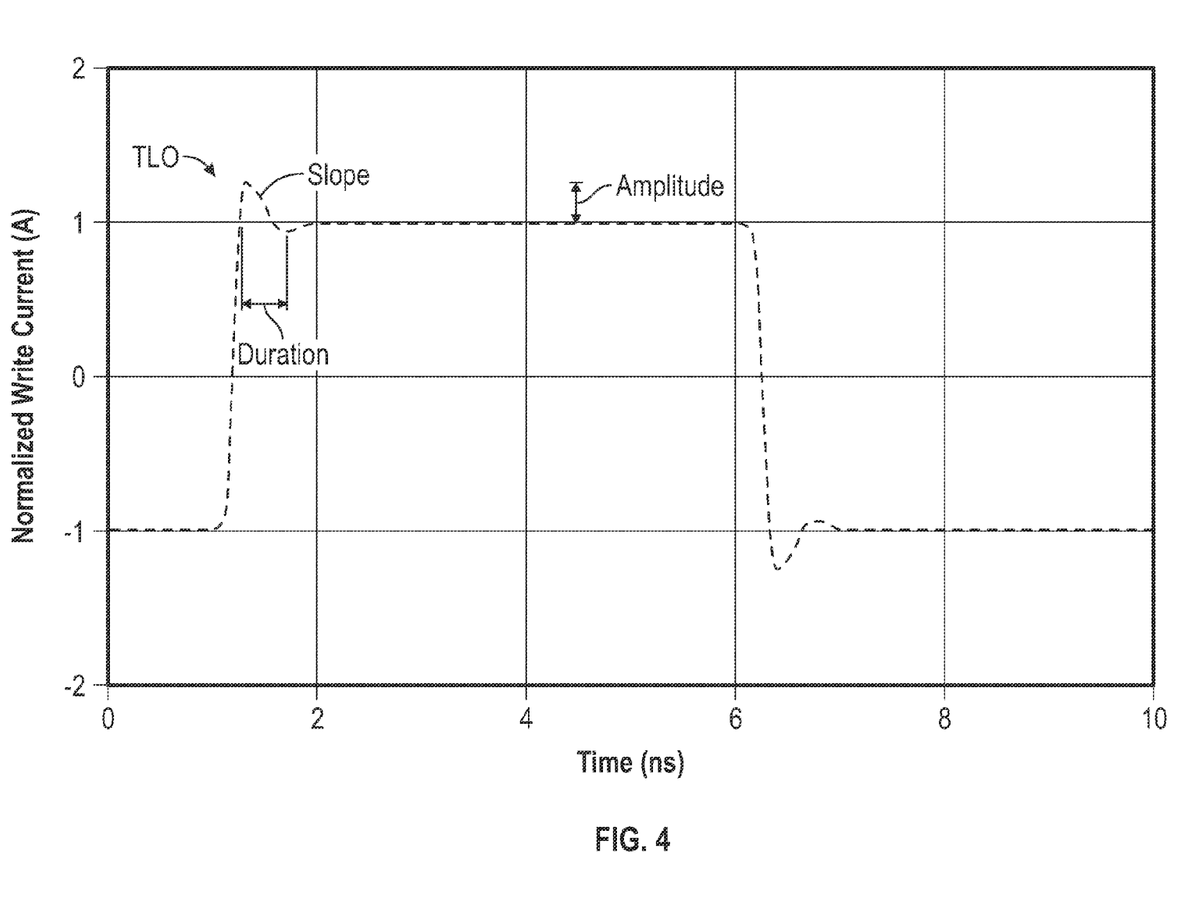
FIG. 4 is a graph of normalized write current as a function of time for a multiple-segment transmission line with segments having different impedance values as a result of having traces with different widths, using a four interleave type structure for all segments along the entire length, according to the prior art.

Transmission line overshoot (TLO) uses transmission line reflections to achieve faster magnetic flux reversals and is described by Jury, J. C. et al. "Designing Disk Drive Interconnects to Obtain a Desired Transmitted Write Current Waveform", IEEE TRANSACTIONS ON MAGNETICS, VOL. 38, NO. 1, JANUARY 2002 pp. 55-60. TLO reduces the overshoot requirement from the write driver circuitry. A multiple-segment transmission line to achieve TLO is described in U.S. Pat. Nos. 7,460,338 B2 and 7,417,818 B2, both assigned to Hitachi. Each segment may have a different impedance value as a result of varying the widths of the traces or the thicknesses of the interconnections between the multiple segments. The impedance values of the segments can thus be selected to achieve the desired amplitude of TLO. FIG. 4 shows the normalized write current with TLO as a function of time for a multiple-segment transmission line with segments having different impedance values as a result of having traces with different widths, using a four interleave type structure for all segments along the entire length. The TLO wave shape is determined primarily by the signal path's impedance value and delay of multiple segments. The four interleave line structure has limited impedance range, typically about 37 to 65 Ohm.

For various design reasons it is desirable to be able to modify the wave shape of the TLO, for example its slope and duration, as well as its amplitude. The present invention provides a wider impedance range for the multiple-segment transmission line that enables a wider optimization range of the TLO wave shape.

Figure 5A:
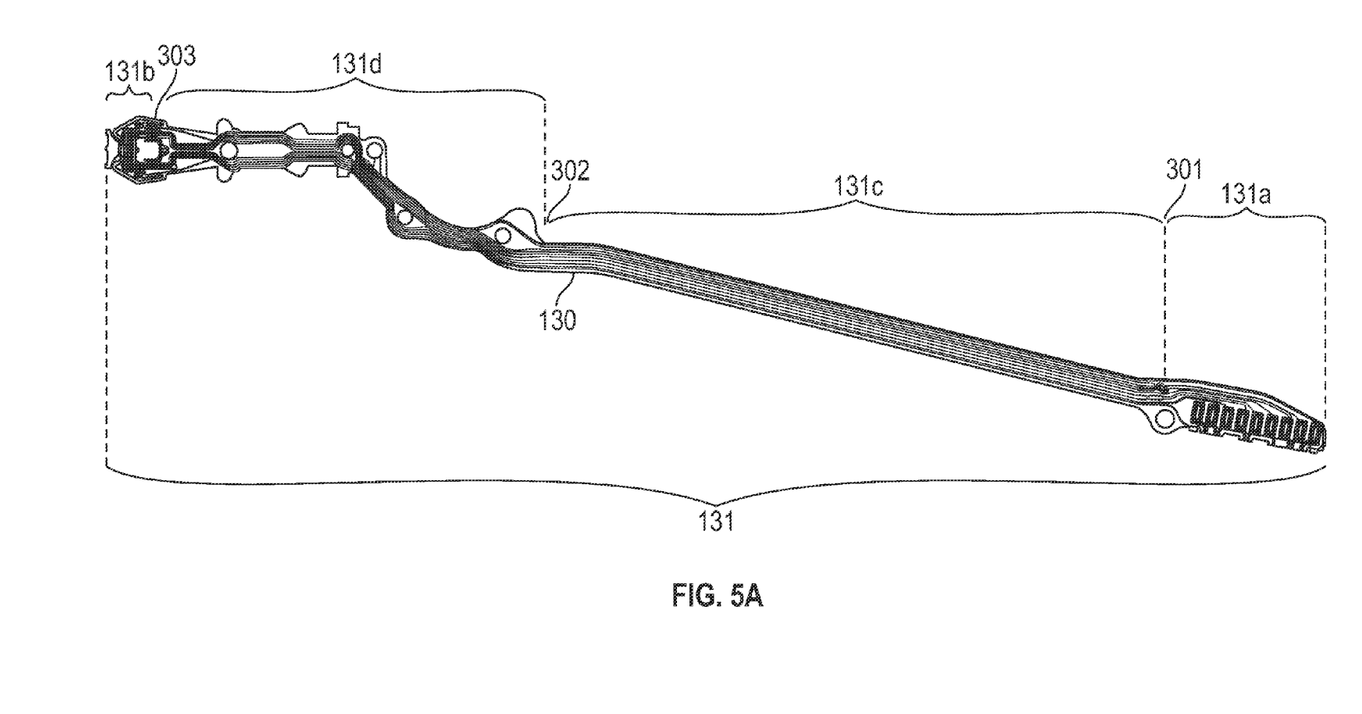
FIG. 5A is a plan view of the ILS according to the invention showing the multiple-segment transmission line according to the invention.

FIG. 5A is a plan view of the ILS 130 according to the invention showing the transmission line 131 that connects the write driver circuitry with the read/write head. The transmission line 131 is a multiple-segment transmission line with a first or flex cable pad segment 131a, an end or gimbal segment 131b and two intermediate segments 131c, 131d. Like the prior art ILS, the ILS 130 is a laminate comprised of three layers: an electrically conductive substrate, an insulating dielectric layer, a conductive layer for the electrical traces or lines, and an optional insulating dielectric cover layer.

Figure 5B:
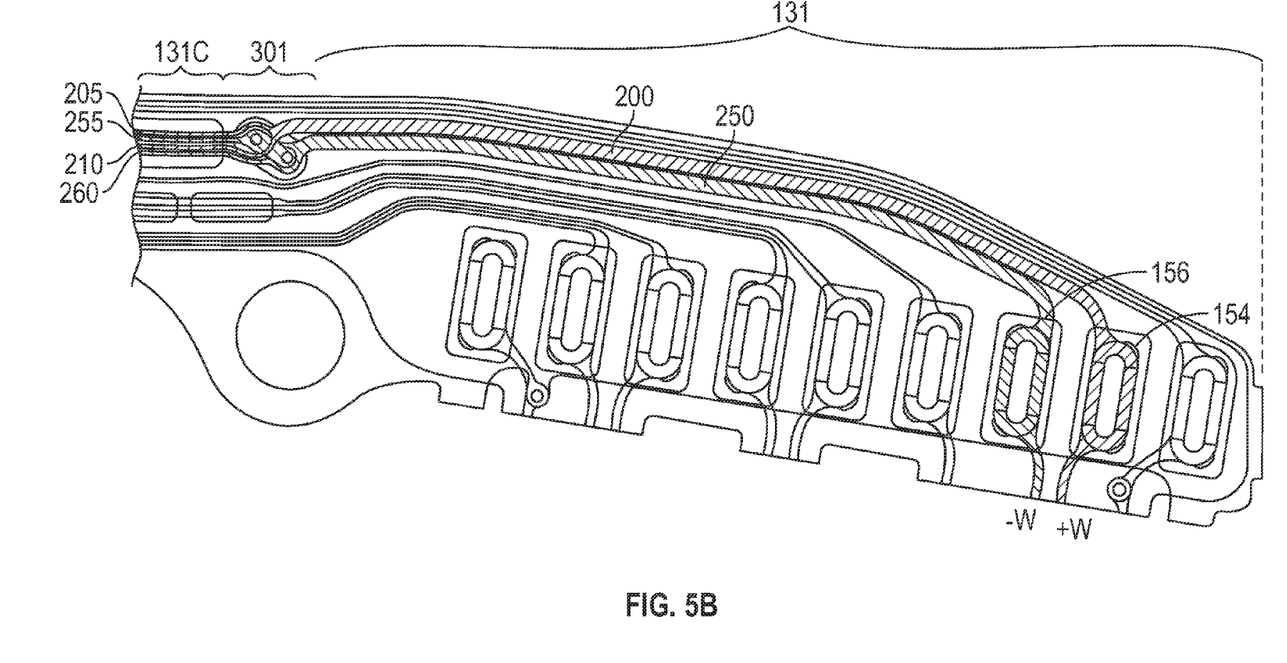
FIG. 5B is an enlarged view of the flex cable pad segment of the ILS shown in FIG. 5A.

The flex cable pad segment 131a, shown in the enlarged view of FIG. 5B, has a plurality of electrical connection pads, like pads 154, 156, that are electrically connected to a chip (not shown) that contains the write driver circuitry via a flex cable (not shown). The pad segment 131a is connected to the first intermediate segment 131c by a segment interconnect 301. The pad segment 131a has two traces 200, 250 for the +W and −W signals that divide into 4 interleaved traces at the interconnect 301. Thus the first intermediate segment 131c contains two +W traces (205, 210) and two −W traces (255, 260) that are interleaved.

Figure 5C:
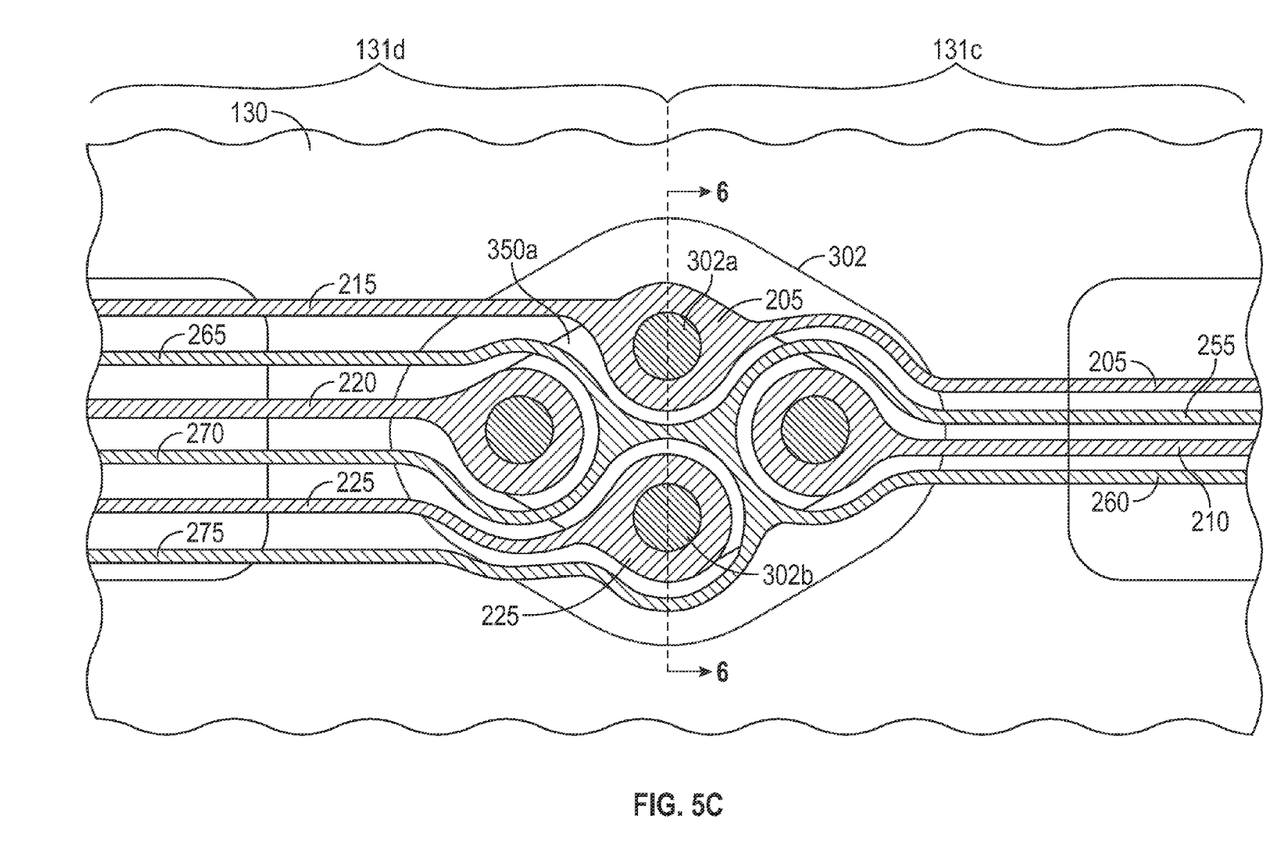
FIG. 5C is an enlarged view of the interconnect between the first and second intermediate segments of the ILS shown in FIG. 5A.

The first intermediate segment 131c, shown in the enlarged view of FIG. 5C, is connected to the second intermediate segment 131d by a segment interconnect 302. The two +W traces (205, 210) and two −W traces (255, 260) in the first intermediate segment 131c divide into 6 interleaved traces at the interconnect 302, which increases the impedance range down to 20 Ohm. Thus the second intermediate segment 131d contains three +W traces (215, 220, 225) and three −W traces (265, 270, 275) that are interleaved.

Figure 5D:
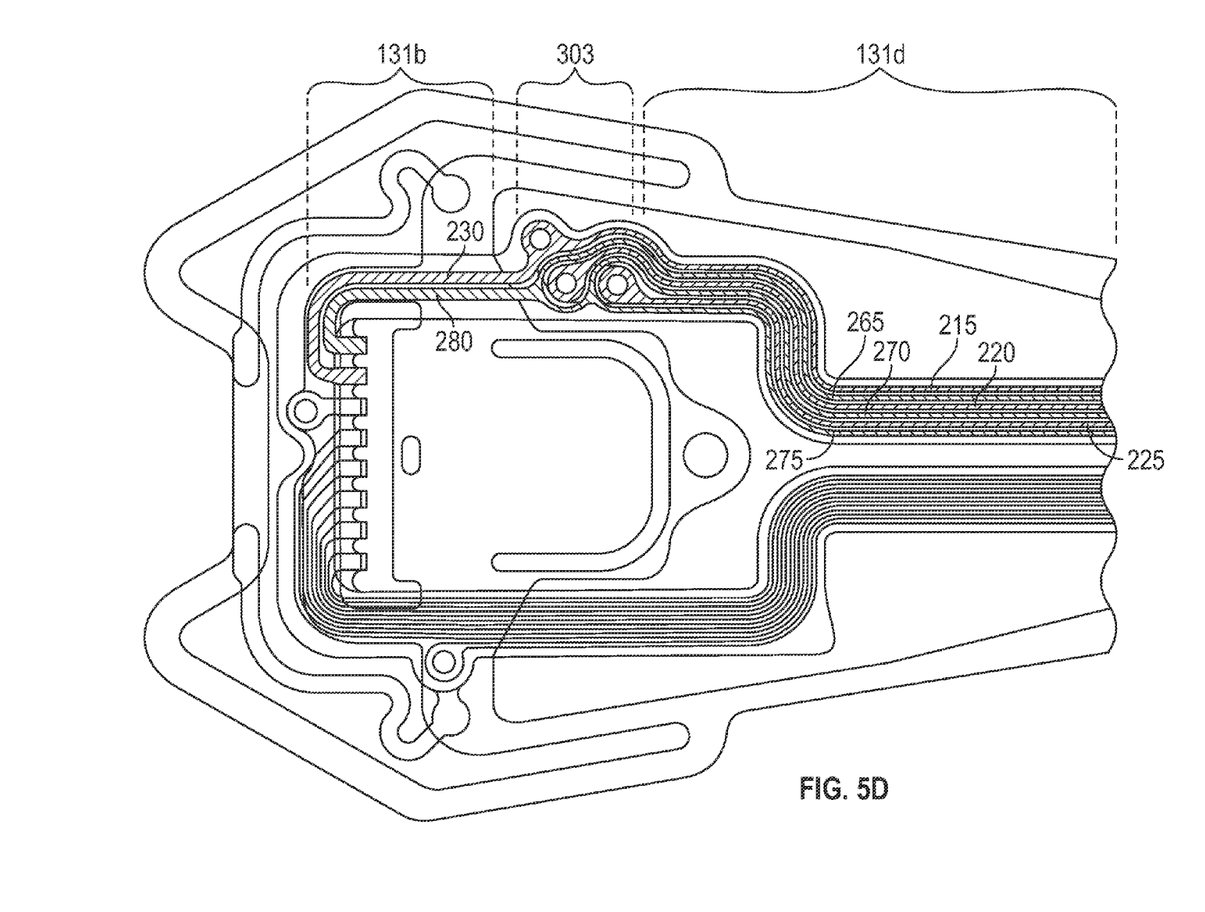
FIG. 5D is an enlarged view of the gimbal segment of the ILS shown in FIG. 5A.

The second intermediate segment 131d, shown in the enlarged view of FIG. 5D, is connected to the end or gimbal segment 131b by a segment interconnect 303. The three +W traces (215, 220, 225) and three −W traces (265, 270, 275) merge into two traces in the gimbal segment 131b at the interconnect 303. Thus the gimbal segment contains a single +W trace 230 and a single −W trace 280 that become connected to the write head (not shown) on the slider (not shown).

In the embodiment shown and described with FIGS. 5A-5D, there are only two intermediate segments and the number of traces in the segments goes in the order from 2 to 4 to 6 to 2. The number of traces in a segment is thus different from the number of traces in the segments to which the segment is immediately connected. However, there may be more than two intermediate segments and the number of traces in each segment and the order of the segments with different numbers of traces can be other than as shown. For example, there could be four intermediate segments with the order going from 2 to 6 to 8 to 4 to 6 to 2. There is an even number of traces in each segment and the traces in each segment are interleaved. The number of segments and the number of traces in each segment can be selected to achieve the desired impedance levels for the different segments to achieve the desired wave shape for the TLO.

Figure 6:
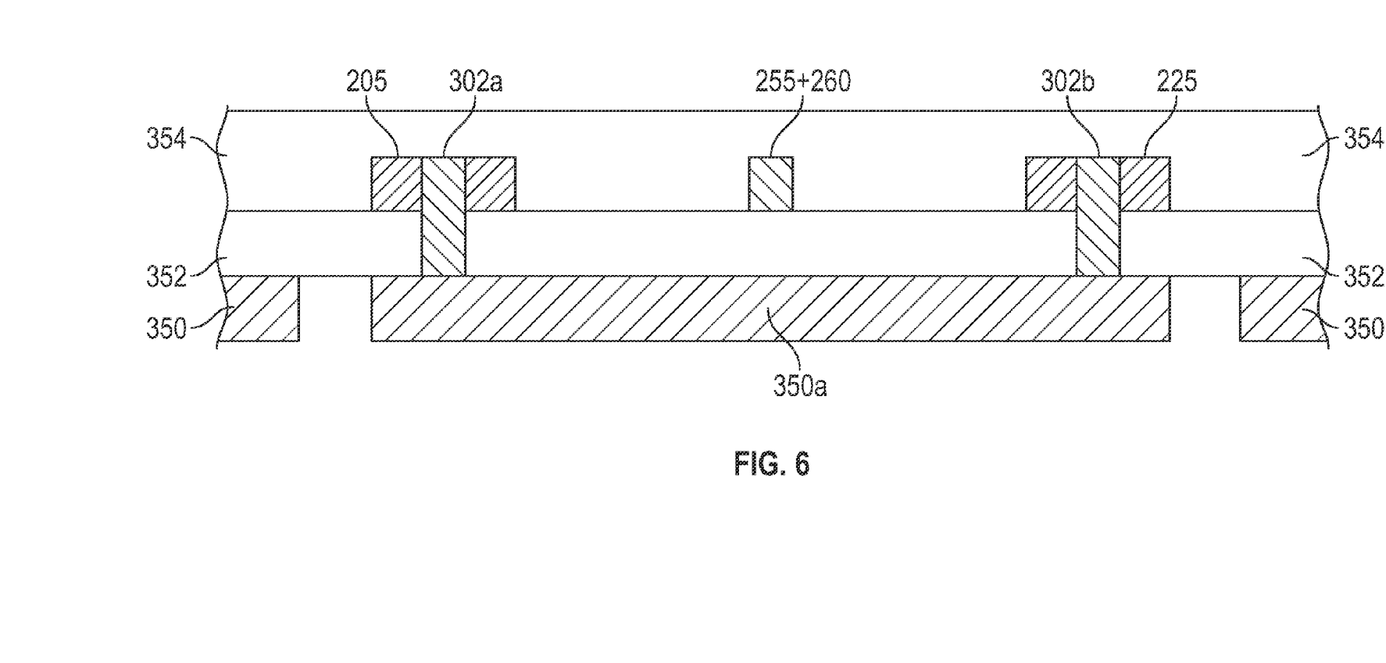
FIG. 6 is a sectional view along section 6-6 of the interconnect of FIG. 5C showing the multiple coplanar crossover interconnect.

All of the traces on the transmission line 131 are preferably coplanar. This is made possible by the use of multiple coplanar crossover interconnects. FIG. 6 is a section along section 6-6 of the interconnect 302 of FIG. 5C. Referring now to FIGS. 5C and 6, the ILS 130 includes an electrically conductive substrate 350, an insulator layer 352 on substrate 350, the electrically conductive traces, like traces 205, 255, 260 and 225 on the insulator layer 352, and an optional insulating cover layer 354. Traces 255 and 260 from the first intermediate segment 131c merge at the interconnect 302 and continue to divide into −W traces 265, 270, 275 at the interconnect 302, as shown in FIG. 5C. The +W traces 205 and 225 are coplanar with the −W traces. As shown in FIG. 6, trace 205 from first intermediate segment 131c is connected to an electrically conductive via 302a which is connected to an electrically isolated island 350a of substrate material. Similarly, trace 225 of second intermediate segment 131d is connected to an electrically conductive via 302b which is connected to island 350a. Thus electrical connection is made from the +W traces 205, 210 of the segment 131c to the traces 215, 220, 225 of segment 131d while permitting these traces to be coplanar with the −W traces 265, 270, 275.

Figure 7:
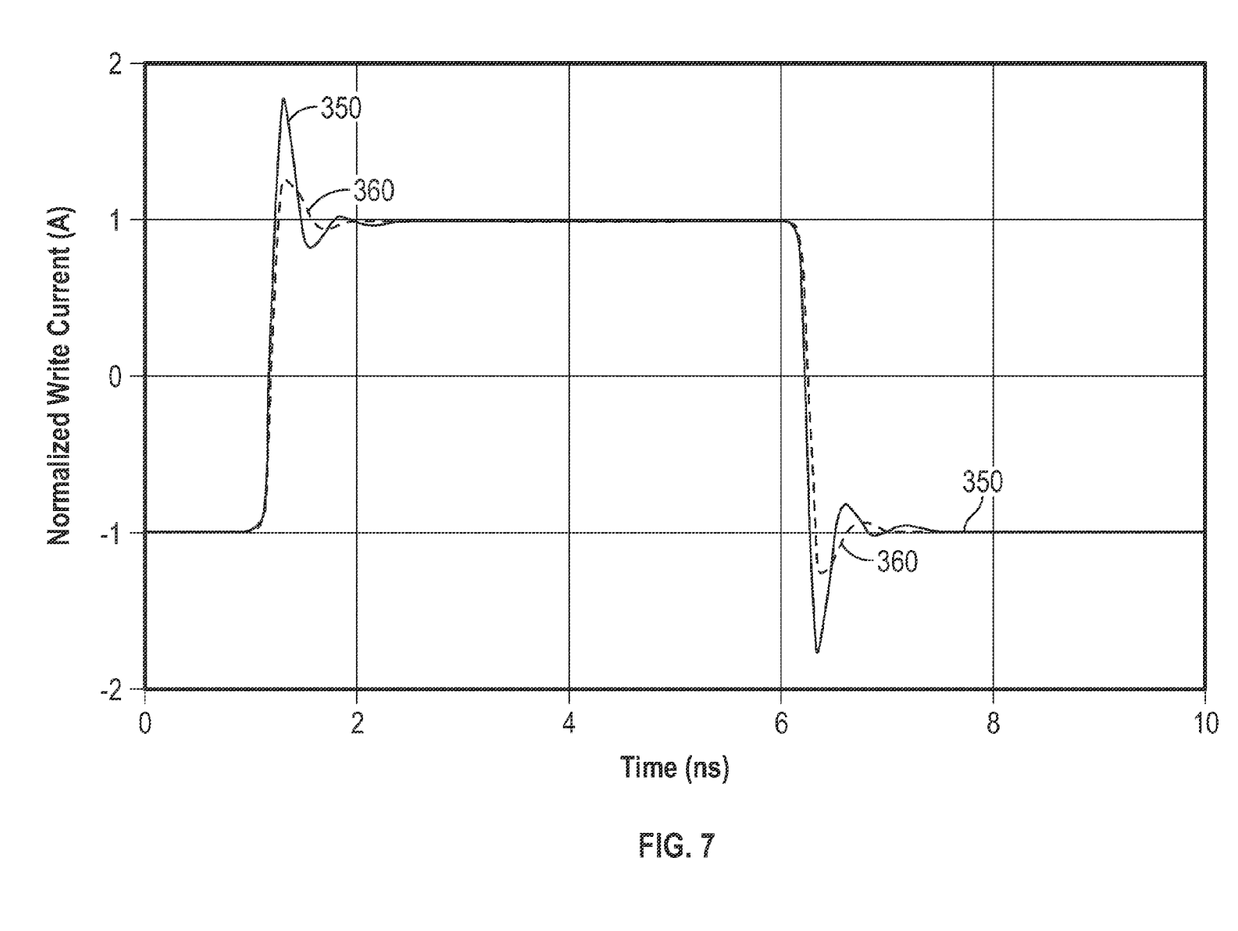
FIG. 7 is a graph of normalized write current as a function of time for a multiple-segment transmission line, with two segments going from 4 interleaved traces to 6 interleaved traces, according to the invention.

FIG. 7 shows the normalized write current with overshoot as a function of time for a multiple-segment transmission line according to the invention. The TLO wave shape (line 350) is for a multiple-segment transmission line with two intermediate segments going from 4 interleaved traces to 6 interleaved traces. The TLO wave shape of line 350 is substantially different from the TLO wave shape (line 360) of FIG. 4, which is for a multiple-segment transmission line with segments having traces with different widths, using a four interleave type structure for all segments along the entire length. The segment change from 4 interleaved traces to 6 interleaved traces creates a significant impedance step to induce more TLO amplitude and shorter duration (wave shape 350) than can be achieved with a uniform 4-interleave structure. Thus the multiple-segment transmission line with segments having different numbers of interleaved traces enables optimization of the different wave shape parameters, such as TLO slope, amplitude and duration.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. In a magnetic recording disk drive having write driver circuitry and an inductive write head, a transmission line between the write driver circuitry and the write head comprising:
    multiple connected transmission line segments, each segment comprising a number of electrically conductive +W traces for positive write signals and an equal number of electrically conductive traces −W traces for negative write signals interleaved with the +W traces, the transmission line including a first segment with two traces for connection to the write driver circuitry, an end segment with two traces for connection to the write head, and at least two intermediate segments, wherein the number of traces in each intermediate segment is greater than two and different from the number of traces in the segments to which it is immediately connected.

2. The transmission line of claim 1 further comprising a substrate and an insulator layer on the substrate, wherein the electrically conductive traces are formed on the insulator layer.

3. The transmission line of claim 2 further comprising segment interconnects between the segments, each interconnect including an electrically conductive island beneath the insulator layer and a plurality of electrically conducting vias connecting said island to selected ones of said traces.

4. The transmission line of claim 3 wherein the traces in the segments are coplanar across the segment interconnects.

5. The transmission line of claim 1 wherein the number of traces in each intermediate segment is selected from 4, 6 and 8.

6. The transmission line of claim 1 wherein an intermediate segment connected to said first segment contains 4 traces and wherein an intermediate segment connected to said end segment contains 6 traces.

7. A system for interconnection of a magnetic recording disk drive write driver to a magnetic recording disk drive write head comprising:
- a write driver;
- an inductive write head;
- a transmission line connecting the write driver to the write head, the transmission line comprising multiple connected transmission line segments, each segment comprising a number of electrically conductive +W traces for positive write signals and an equal number of electrically conductive −W traces for negative write signals interleaved with the +W traces, the transmission line including a pad segment with two traces for connection to the write driver circuitry, a gimbal segment with two traces for connection to the write head, and at least two intermediate segments, wherein the number of traces in each intermediate segment is greater than two and different from the number of traces in the segments to which it is immediately connected, and wherein all of said traces are coplanar; and
- wherein said at least two intermediate segments further comprise an electrically conductive substrate, an insulator layer on the substrate, the traces being formed on the insulator layer, and an interconnect between said at least two intermediate segments, the interconnect comprising an electrically conductive island of substrate beneath the insulator layer and a plurality of electrically conducting vias connecting said island to selected ones of said traces.

8. The system of claim 7 wherein the traces in the segments are coplanar across the segment interconnects.

9. The system of claim 7 wherein the number of traces in each intermediate segment is selected from 4, 6 and 8.

10. The system of claim 7 wherein an intermediate segment connected to said first segment contains 4 traces and wherein an intermediate segment connected to said end segment contains 6 traces.

\* \* \* \* \*